(12) United States Patent
Montagna

(10) Patent No.: US 6,471,310 B2
(45) Date of Patent: Oct. 29, 2002

(54) CIRCUIT BOARD RETAINING ASSEMBLY

(75) Inventor: Joseph J. Montagna, Acton, MA (US)

(73) Assignee: Sun Microsystems, Inc., Palo Alto, CA (US)

( * ) Notice: Subject to any disclaimer, the term of this patent is extended or adjusted under 35 U.S.C. 154(b) by 27 days.

(21) Appl. No.: 09/766,697

(22) Filed: Jan. 22, 2001

(65) Prior Publication Data

US 2002/0096980 A1 Jul. 25, 2002

(51) Int. Cl.[7] .............................. A47B 97/00; E05C 3/04
(52) U.S. Cl. ................... 312/223.2; 292/206; 361/801; 312/319.1
(58) Field of Search ...................... 312/223.1, 223.2, 312/319.1, 319.2; 361/683, 801, 816; 211/26, 41.17; 292/229, 206

(56) References Cited

U.S. PATENT DOCUMENTS

| 113,467 A | * | 4/1871 | Thompson | 292/206 |
| 1,071,999 A | * | 9/1913 | Gilson | 292/206 |
| 1,446,364 A | * | 2/1923 | Wheeler | 292/206 |
| 4,099,754 A | * | 7/1978 | Hoebing | 292/206 |
| 5,785,398 A | * | 7/1998 | Park | 312/223.2 |
| 5,823,644 A | * | 10/1998 | Suh et al. | 312/223.2 |
| 6,147,872 A | * | 11/2000 | Roy | 361/801 X |
| 6,185,106 B1 | * | 2/2001 | Mueller | 361/801 X |

FOREIGN PATENT DOCUMENTS

DE 911971 * 5/1954 ............ 312/319.5

* cited by examiner

Primary Examiner—James O. Hansen
(74) Attorney, Agent, or Firm—Cesari and McKenna, LLP; John L. Capone, Esq.

(57) ABSTRACT

A circuit board retaining assembly for coupling a component to a chassis without concern for the loss of mounting hardware, such as for coupling computer hardware to a computer chassis, and for doing so particularly when the component is in operation. The retaining assembly includes a mounting bracket for mounting the assembly to the chassis, a lever extending from the mounting bracket, and a lever biasing member for pivotally biasing the lever away from the chassis when the component is installed in or removed from the chassis. The mounting bracket includes at least one lever opening for receiving the lever. The lever includes a first end for releasably coupling the component to the chassis. The lever-biasing member is disposed between the mounting bracket and the lever to bias the lever away from the chassis when it is disengaged from the chassis.

11 Claims, 9 Drawing Sheets

CIRCUIT BOARD RETAINING ASSEMBLY

FIELD OF THE INVENTION

The present invention relates to the field of computers and computer systems. More particularly, this invention relates to a circuit board retaining assembly for installing or removing computer hardware in a computer chassis and to a method for using the retaining assembly of the present invention.

BACKGROUND INFORMATION

Computer circuit boards in the art typically include a mounting bracket for mounting the circuit board in a computer and a connector mounted on the mounting bracket for establishing a connection between the circuit board and the computer. The mounting brackets are fabricated from steel, and include a cutout to assist in positioning the circuit board within the computer and one or more board support tabs for supporting is and retaining the circuit board mounted on the bracket. Circuit boards are installed in the computer by loosening or removing the mounting screw from threaded screw holes in the I/O area of the chassis, fitting the board under the loosened mounting screw, and tightening the screw over the cutout to secure the bracket against the computer chassis.

It has long been the practice in the computer industry that any circuit board work performed on a computer is performed on a bench or work surface to minimize the potential for losing the mounting screws. It has also been the practice that before a circuit board is installed in or removed from a computer system, the computer has to be shut down and the power to the system must be turned off. Where this service is not performed carefully or in the proper environment, the mounting screws can become lost either outside of the computer or within the computer itself. Loss of the mounting screws outside the computer creates the inconvenience of having to find the screws or replace them with suitable replacement screws. Loss of the mounting screws within the computer raises the added risk of short-circuiting the computer or injury to the person performing the service. Despite these risks, such practices were heretofore common in the industry.

Other devices have been produced to facilitate the installation or removal of computer hardware on a computer system, and to do so also while the computer is still in operation (e.g., "hot-swapped"). Typical of the art are those assemblies that include a series of plastic clips that are mounted to the side of the frame of the computer chassis and which slide over the end of the PCI or expansion card once the card is inserted into place. These devices are however ineffective substitutes for the screws as they fail to positively secure the card in the computer. They also fail to prevent the possibility that the boards may detach from the chassis due to the vibrations that are incident to the normal operation of the computer. Accordingly, a circuit board retaining assembly that permits computer hardware to be mounted in a computer chassis while the computer is in operation, without risk of loss of the mounting hardware, is desired.

SUMMARY OF THE INVENTION

This invention addresses the above described disadvantages by providing a positive acting circuit board retaining assembly for hot-swapping computer hardware in a computer chassis without concern for the loss of hardware mounting devices.

The circuit board retaining assembly includes a mounting bracket for mounting the assembly to the chassis of a computer, a lever pivotally extending from the mounting bracket for releasably engaging a circuit board at a cutout, and a lever biasing member for biasing the lever away from the chassis so that the board can be installed in or removed from the computer chassis. The mounting bracket includes at least one mounting opening for mounting the retaining assembly on the chassis, and a lever opening for receiving the lever. The lever includes a first end for releasably engaging the circuit board cutout and a second end for being positioned in the lever opening. The lever-biasing member is disposed between the mounting bracket and the lever to bias the lever away from the chassis when the circuit board is hot-swapped into or from the computer.

In use, the circuit board retaining assembly is mounted on the computer chassis near the I/O ports on the rear of the chassis. One or more fasteners are inserted through mounting openings to secure the mounting bracket to the chassis, and one or more PCI or expansion cards are inserted into to or removed from the appropriate slots in the chassis to modify the capacity of the computer, as desired.

The present invention also provides a method for installing or removing computer hardware in a computer using the retaining assembly of the present invention. The method includes the steps of mounting the assembly to the chassis, disengaging the lever from the mounting bracket, installing or removing hardware in the chassis, and reengaging the lever in the mounting bracket to releasably secures the hardware in the chassis.

BRIEF DESCRIPTION OF THE DRAWINGS

The above mentioned features of the invention will become more clearly understood with reference to the following detailed description as illustrated by the drawings in which.

DETAILED DESCRIPTION

Figure 1:
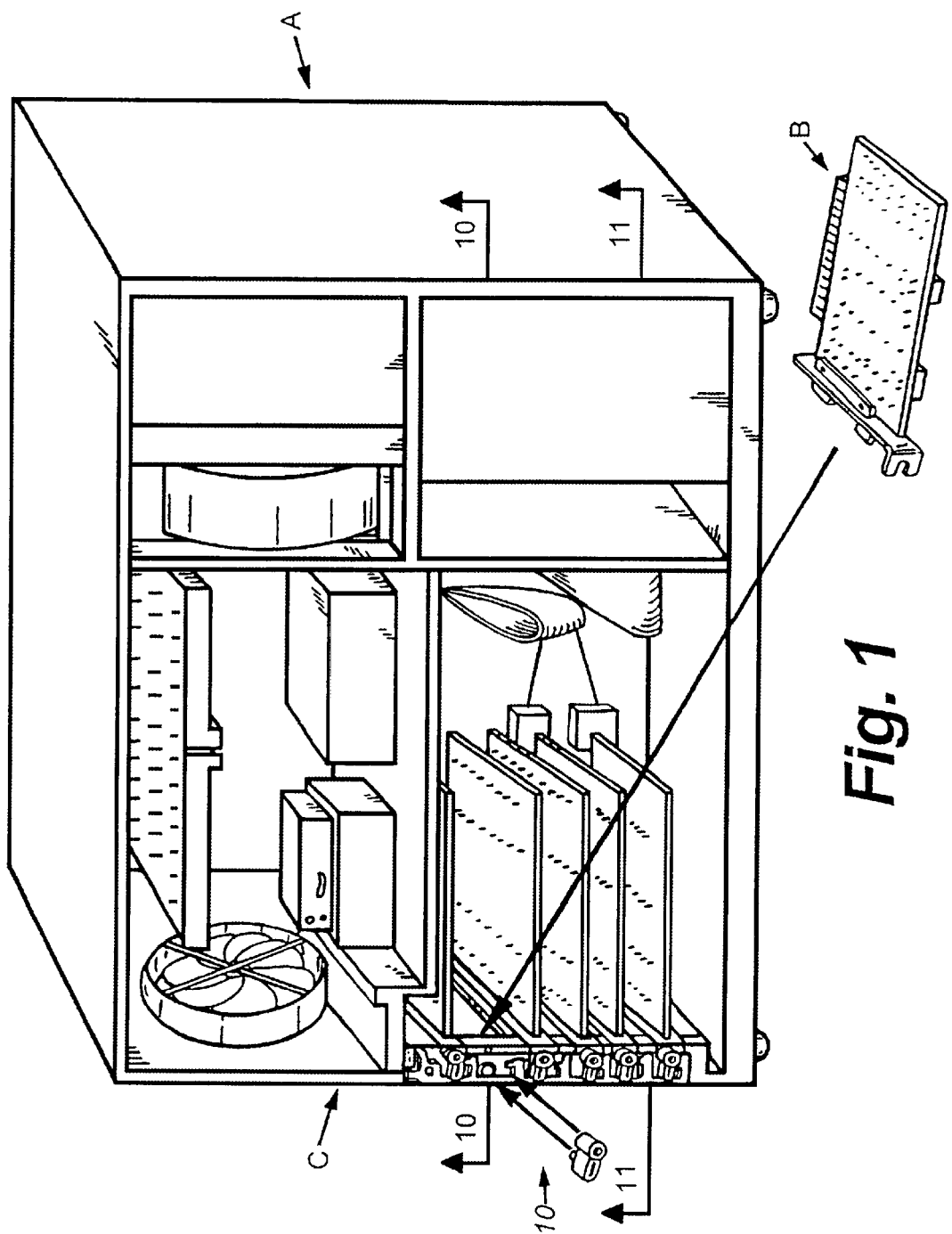
FIG. 1 is a perspective view of a computer chassis including the circuit board retaining assembly of the present invention.

FIG. 1 illustrates a circuit board retaining assembly incorporating various features of the present invention. The circuit board retaining assembly 10 is designed for quickly and safely installing or removing computer hardware B (i.e., PC boards, expansion cards, etc.) in the "cage" or chassis C of a computer A. In one embodiment, the circuit board retaining assembly 10 enables the installation and removal of PCI/expansion cards B from the computer chassis C while the computer A is "hot" (i.e., in operation).

Figure 2:
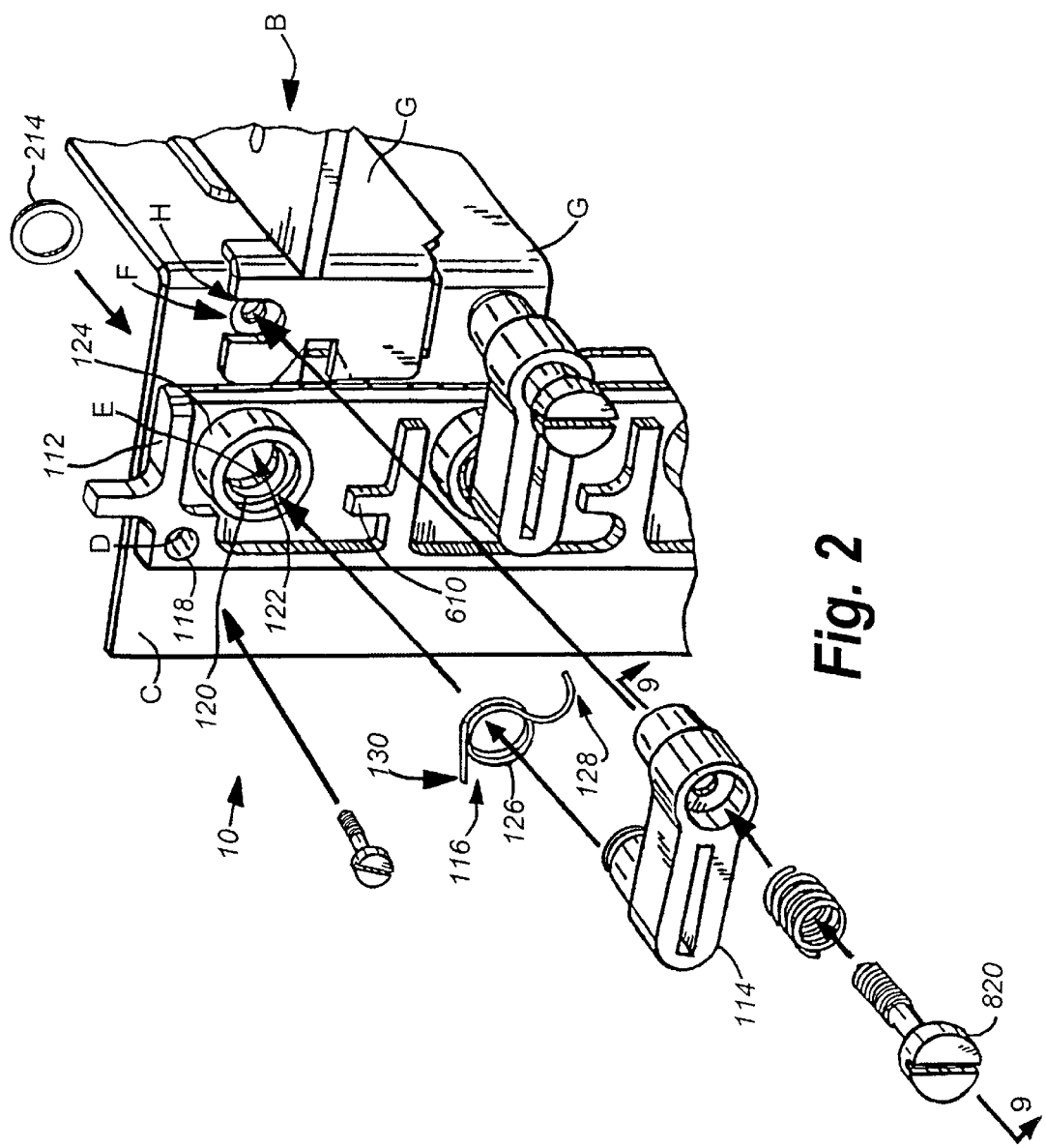
FIG. 2 is an exploded view of a portion of the circuit board retaining assembly shown in FIG. 1

As shown in FIG. 2, the circuit board retaining assembly 10 of the present invention includes a mounting bracket 112 for mounting the circuit board retaining assembly 10 to the computer chassis C, a lever 114 pivotally extending from the mounting bracket 112 for releasably engaging the hardware B in the chassis C, and a lever biasing member 116 for biasing the lever 114 away from the chassis C when the hardware B is installed in or removed from the chassis C. More particularly, the lever 114 engages a cutout F on a hardware mounting bracket G and a mounting screw opening H on the chassis C to secure the board B to the chassis C when it is installed, and release the board B from the chassis C when it is disengaged.

Figure 3:
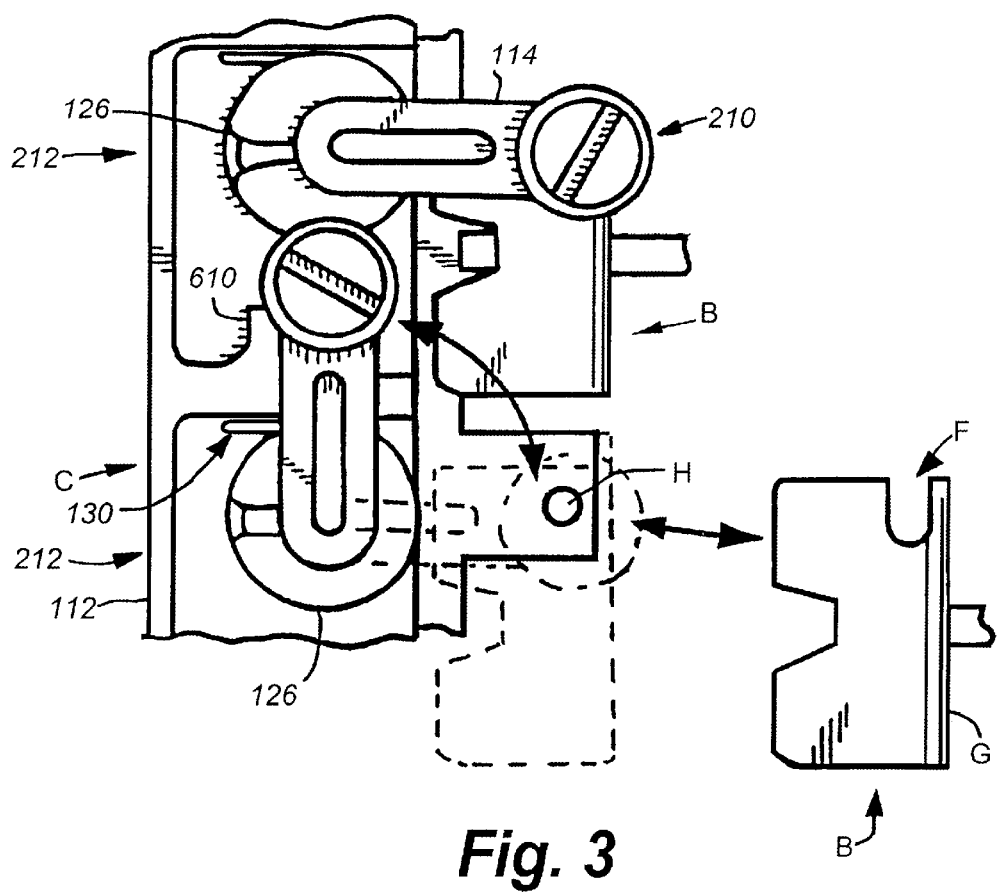
FIG. 3 is a side elevation view of the present invention showing one lever in a closed position and one lever in an open position.
Figure 4:
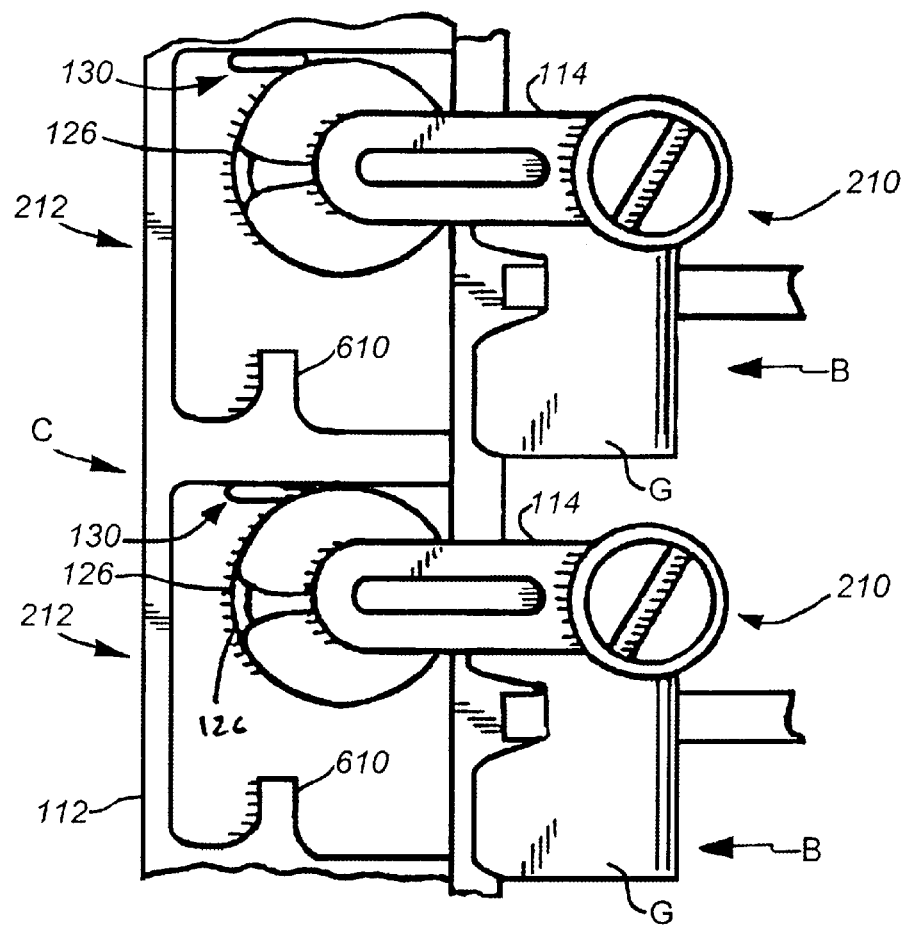
FIG. 4 is a side elevation view of the present invention showing two levers each in the closed position
Figure 5:
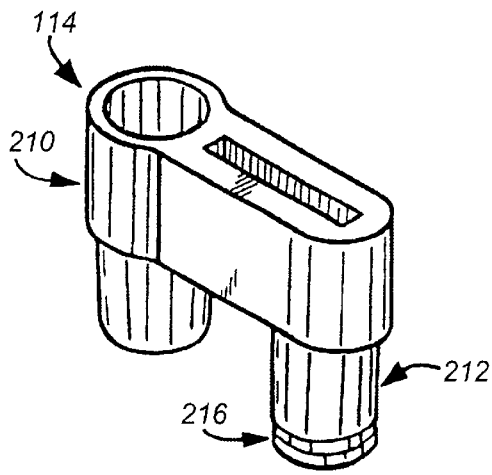
FIG. 5 is a perspective view of the lever of the present invention.

As shown in the perspective view of FIG. 1, and in the exploded views of FIGS. 3 and 4, for example, the present invention contemplates a circuit board retaining assembly 10 including one or more levers 114 pivotally disposed on the mounting bracket 112. Accordingly, it will be understood that the circuit board retaining assembly 10 of the present invention can be configured to include an appropriately dimensioned mounting bracket 112 and the number of levers 114 necessary for the intended use of this assembly. That is, the circuit board retaining assembly 10 may be configured to releasably mount at least one, or several hardware components B to a computer chassis C.

As also shown in FIG. 2, the mounting bracket 112 includes at least one mounting opening 118 for mounting the circuit board retaining assembly 10 on the computer chassis C and a lever opening 120. In one embodiment, the chassis C includes two chassis openings D, E that correspond to the mounting opening 118 and the lever opening 120 of the circuit board retaining assembly 10, respectively. Mounting opening 118 and chassis opening D cooperate to securely seat the mounting bracket 112 to the chassis C. Lever opening 120 and chassis opening E cooperatively define a through opening 122 for receiving the lever 114. As further shown in FIG. 2, the mounting bracket 112 also includes a boss 124 disposed about the lever opening 120.

The circuit board retaining assembly 10 can be configured such that lever 114 is mountable to the mounting bracket 112 alone so that the circuit board retaining assembly 10 may be retrofit onto the chassis of an already built computer. Indeed, given such a configuration, retrofitting is accomplished by drilling the necessary mounting openings in the chassis C of the computer A.

As shown in FIGS. 3–8, the lever 114 includes a first end 210 for releasably engaging the hardware B installed in the chassis C and a second end 212. More particularly, the first end 210 of lever 114 releasably engages the cutout F of the mounting bracket G. The boss 124 assists in positioning the second end 212 of the lever 114 on the mounting bracket 112 (FIG. 2). In the described embodiment, a portion 216 of the second end 212 of the lever 114 extends through opening 120 and a retainer ring 214 is positioned on the second end of the lever 114 to secure the second end of the lever 114 to the mounting bracket 112. The retainer ring 214 pivotally anchors the second end 212 of the lever 114 to the mounting bracket 112 and the chassis C. While a retainer ring is one example of a retainer for pivotally anchoring the second end 212 of the lever 114, it will be recognized that other retaining devices including a cotter pin, for example, are equally adaptable for securing the second end 212 of the lever 114. It will also be recognized that the second end 212 of the lever 114 may be configured to be pivotally mountable onto the mounting bracket 112 without the need for a retainer. Where the second end 212 of the lever 114 is configured to be snap-fit into the lever through opening 122, for example, no further anchoring is necessary.

The lever-biasing member 116 is disposed between the lever 114 and the mounting bracket 112 to bias the lever 114 away from the mounting bracket 112 when computer hardware B is installed in or removed from the chassis C. As illustrated in FIG. 2, the lever-biasing member 116 is a torsion spring 126 having a first end 128 and a second end 130. The torsion spring 126 is friction fit onto the boss 124. The first end 128 of the spring 126 is preferably curved to fit about an arc of the first end 210 of the lever 114. Other configurations for the lever-biasing member 116 are also foreseeable. For example, the lever-biasing member 116 can be molded into either of the lever 114, the mounting bracket 112 or the boss 124.

As illustrated in FIGS. 3 and 4, the mounting bracket 112 preferably further defines a stop 610 and the second end 130 of the spring 126 abuts the stop 610. In this embodiment, as illustrated in FIG. 3, the torsion spring 126 is in an unloaded position when the first end 210 of the lever 114 is disengaged from the chassis C and in contact with stop 610. The spring 126 is loaded when the first end 210 of the lever 114 is rotated toward the cutout F, to engage the hardware B, as shown in FIG. 4. The tension created in the spring 126 by rotation of the lever 114 enables the first end 210 of the lever 114 to retract to the unengaged position when the hardware B is to be installed or removed from the chassis C. The stop 610 can be any structure sufficient to delimit the range of motion of the first end 210 of the lever 114. The stop 610 can be disposed in a number of positions and still function effectively. Separate stops, not shown, can be used for each of the first end 210 of the lever 114 and the spring 126, as well. In one embodiment, as shown in the figures, the stop 610 is positioned no more than approximately 90° from the loaded position of the lever 114 and functions as both a spring stop and a lever stop.

Figure 9:
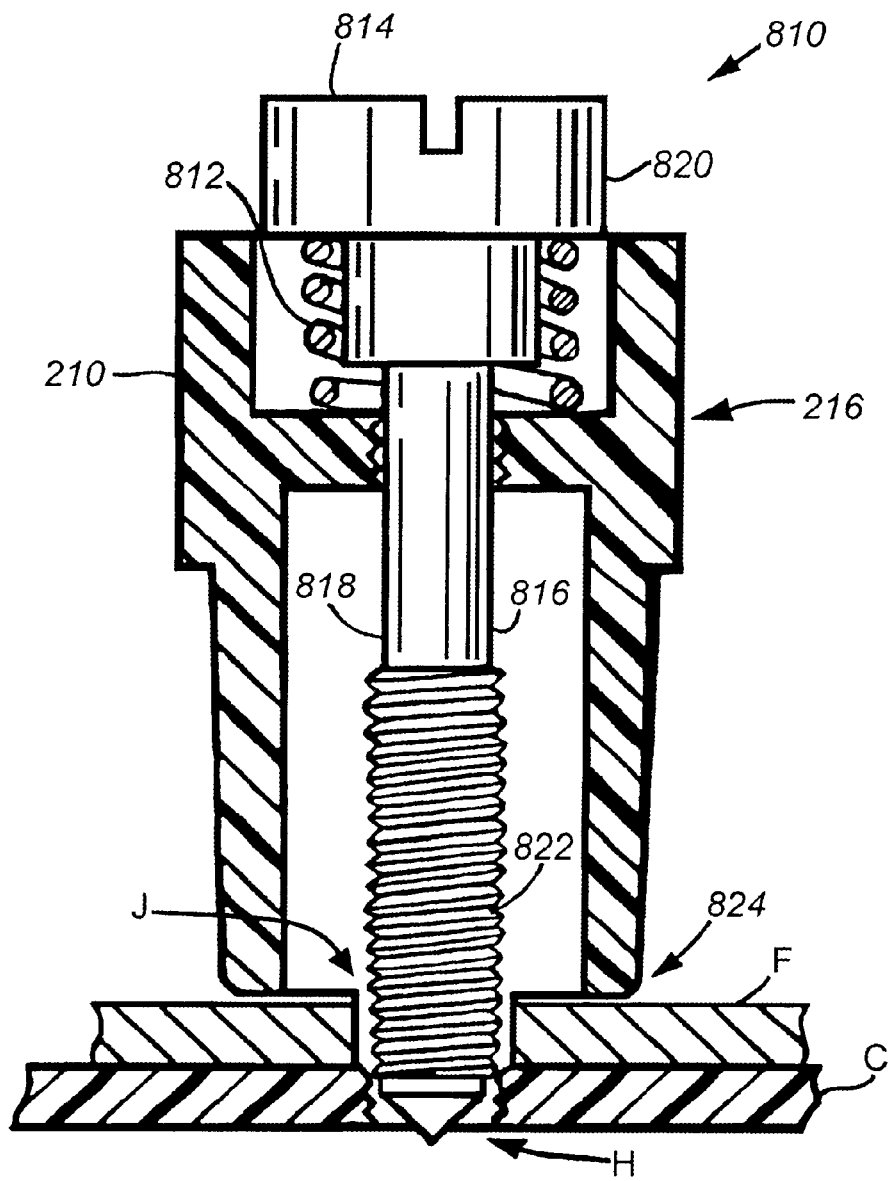
FIG. 9 is a side elevation view of the lever, securement device and securement device biasing member of the present invention, in section, taken at 9—9 of FIG. 2.

As illustrated in FIG. 9, the circuit board retaining assembly 10 of the described embodiment also includes a securement device 810 and a securement device-biasing member 812 engaged in a through-opening 216 defined in the first end 210 of the lever 114. The securement device 810 engages the lever 114 and the cutout F to securely seat the hardware B in the chassis C. The biasing member 812 biases the securement device 810 away from the cutout F when the securement device 810 is disengaged from the chassis C. While the cutout F illustrated in the figures is a slot, it will be recognized that the cutout F may comprise an opening or hole that is formed separately from or integrally with the hardware B.

In the exemplary embodiment, the securement device 810 is a screw 820 having a screw head 814 formed for engaging a tool, and a screw shaft 816. The screw shaft 816 includes a partially unthreaded shaft portion 818 and a partially threaded shaft portion 822. The biasing member 812 is generally disposed about the unthreaded portion 818 of the screw shaft 816. In this embodiment, the biasing member 812 is a compression spring is that is disposed about the shaft 816. The threaded portion 822 of the screw 820 engages the mounting screw opening H on the chassis C to securably seat the hardware B to the chassis C. While an exemplary securement device 810 is described and shown, still other devices are also adaptable for the present invention. For example, the securement device 810 may also be a screw having a screw head configured to be manually manipulated and a screw shaft that is partially unthreaded.

As also shown in FIG. 9, the first end 210 of the lever 114 captures the securement device 810 about the non-threaded portion 818 of the screw shaft 816. More particularly, the through opening 216 of the first end 210 of the lever 114 is variably dimensioned to permit only the non-threaded portion 818 of the shaft 816 to slidably move back and forth therethrough. The first end 210 of the lever 114 also provides a face 824 that defines a diameter that is larger than that of the screw shaft 816. The screw head 814 and the threaded portion 822 of the screw shaft 818 are unable to pass through the through opening 216. Such a configuration operates to ensure that the screw 820 does not become lost. It also ensures that the screw 820 does not fall into the chassis C when it is disengaged, thereby preventing damage to the computer and/or injury to the service technician.

Figure 6:
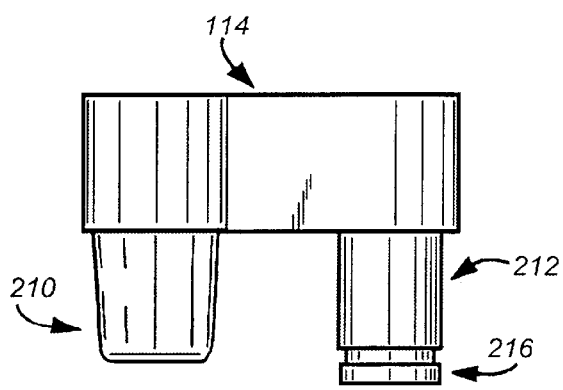
FIG. 6 is a side elevation view of the lever shown in FIG. 5.
Figure 7:
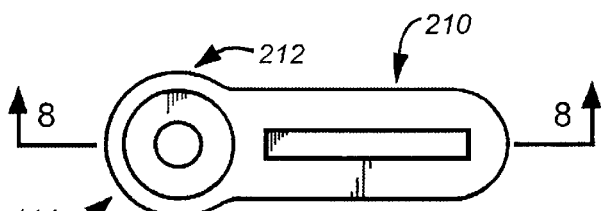
FIG. 7 is a top view of the lever shown in FIG. 5.
Figure 8:
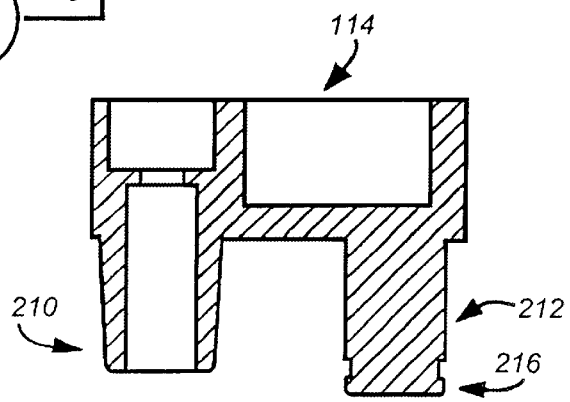
FIG. 8 is a side elevation view of the lever of the present invention, in section, taken at 8—8 of FIG. 7.

The structure of the first and second ends 210, 212 of the lever 114 may vary in length, width and shape. As illustrated in FIGS. 6 and 8, the first end 210 of the lever 114 is somewhat tapered. The tapering provides a larger overall surface for receiving the securement device 810. Moreover, the tapered end focuses the pressure of the lever 114 against the installed hardware B to secure it within the chassis C, and avoids inadvertent detachment of the hardware B due to the incidental vibrations of the chassis C.

As further illustrated in FIGS. 6 and 8, the second end 212 of the lever 114 defines a generally circular shape. Such a lever shape withstands the stresses placed upon the lever end 212 during use of the device 10, and permits rotational movement of the lever 114. In one embodiment, the second end 212 of the lever 114 is somewhat longer than the first end 210, to account for that portion of the second end 212 that is received through the lever opening 120.

Figure 10:
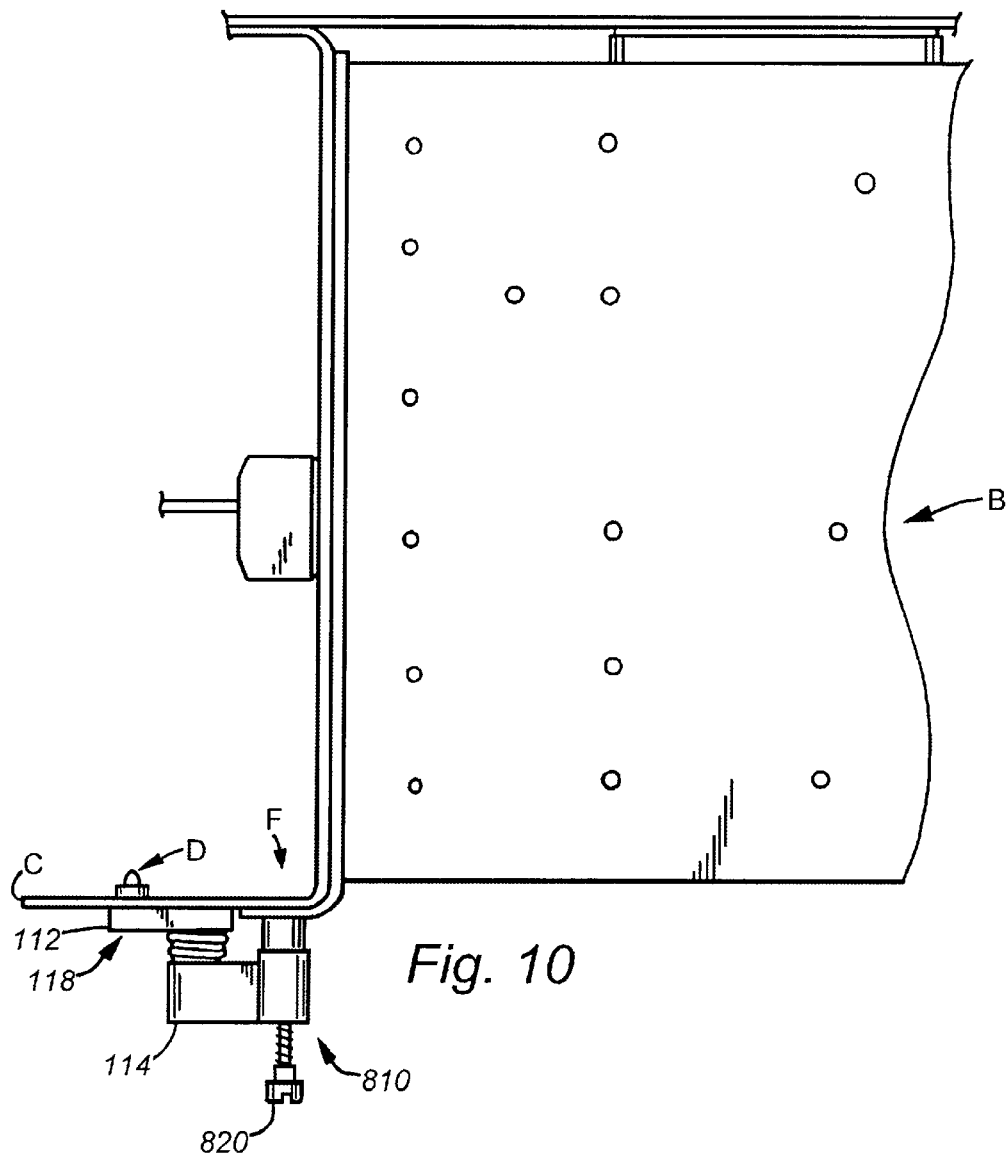
FIG. 10 is a top plan view of the present invention with the securement device in the open position.
Figure 11:
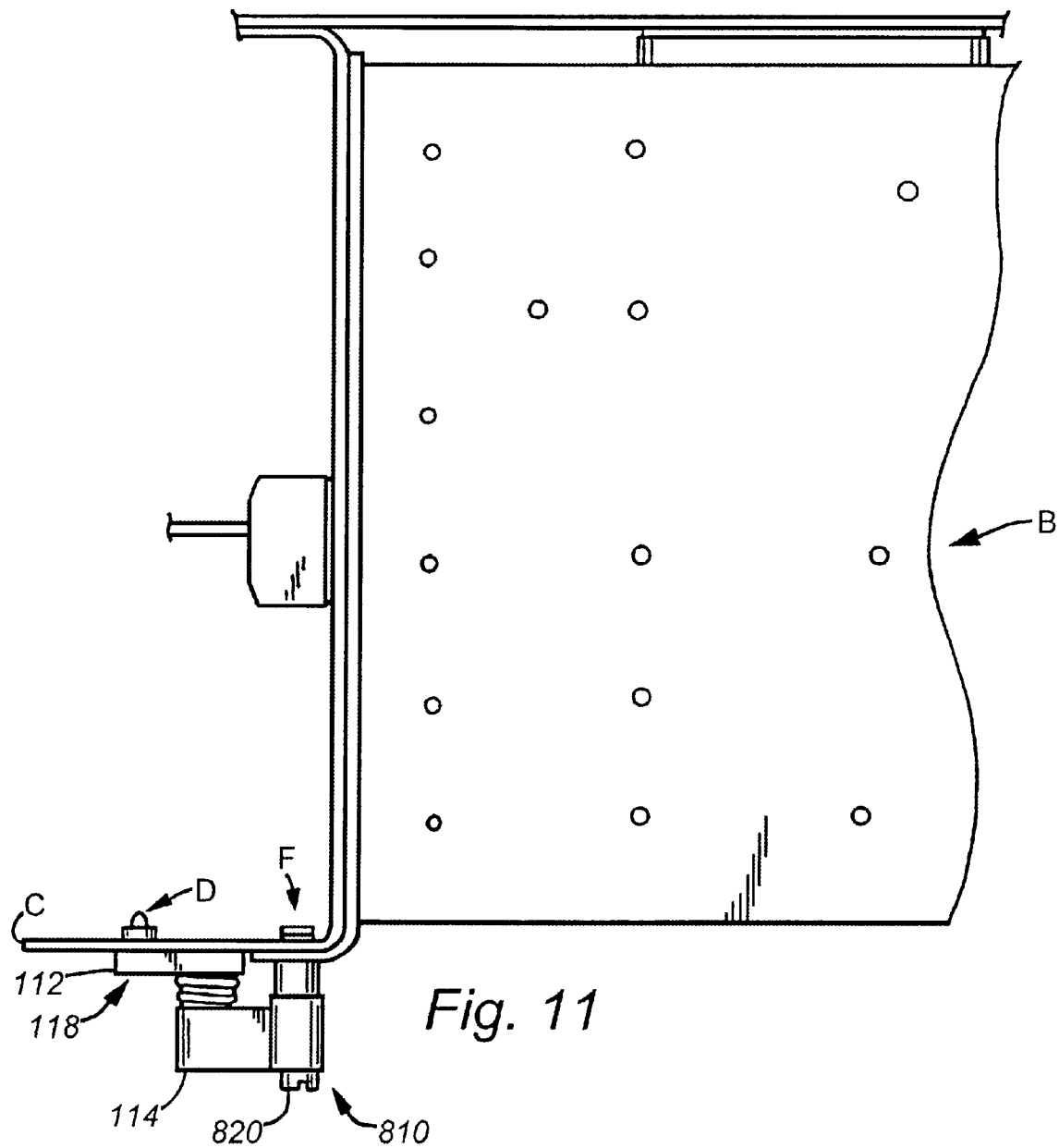
FIG. 11 is a top plan view of the present invention with the securement device in the closed position.

The embodiment of the present invention shown in FIG. 1 illustrates a retaining assembly 10 mounted on a chassis C, and a number of hardware components B securely is seated in the chassis C using the assembly 10. FIGS. 10 and 11 provide top plan views of the chassis C of FIG. 1, taken in section. These figures illustrate different points of installation of the hardware B, using one embodiment of the retaining assembly 10. As shown in these figures, the retaining assembly 10 of the present invention is mounted on the rear of the chassis C near I/O ports. One or more fasteners D are inserted through mounting openings 118 and secure the mounting bracket 112 to the chassis C. One or more hardware components B are inserted into the appropriate slots to adjust the capacity of the computer A, as desired, and the levers 114 are engaged against the hardware components B and the chassis C to securely seat the hardware B in the chassis C.

In an alternative embodiment, not shown, the circuit board retaining assembly 10 includes a mounting bracket 112 for mounting the assembly 10 to the computer A, a lever 114 pivotally extending from the mounting bracket 112 for releasably engaging the hardware B in the chassis C. The lever 114 includes a securement device 810 for securing the lever 114 and the hardware B to the chassis C, and a securement device biasing member 812 for biasing the securement device 810 away from the cutout F when the device 810 is disengaged from the chassis C. The lever 114 includes an end that is configured to capture an end of the securement device 810, and the securement device 810 includes an end that is configured to be captured within the end of the lever 114.

In another alternative embodiment, also not shown, the circuit board retaining assembly 10 includes a mounting bracket 112 for mounting the retaining assembly 10 to the computer, a lever 114 pivotally extending from the mounting bracket 112 for engaging the computer hardware B in the chassis C, a securement device 810 received in the lever 114 for securing the lever 114 and the hardware B to the chassis C; and a biasing member 116 for biasing the lever 114 away from the cutout F when the device 810 is disengaged from the computer A.

Figure 12:
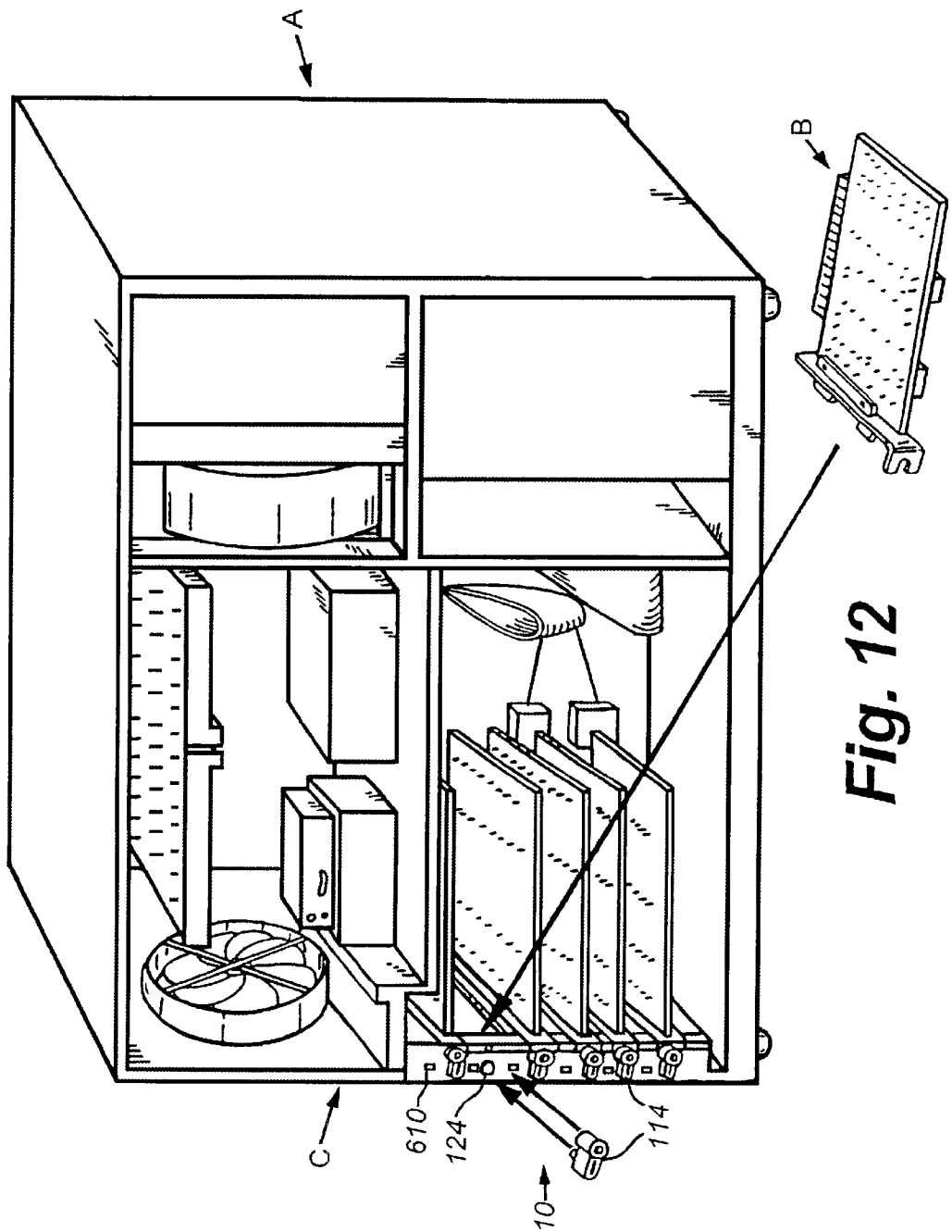
FIG. 12 is a perspective view of a chassis computer including an alternate embodiment of the circuit board retaining assembly of the present invention.

In a third alternative embodiment shown in FIG. 12, the levers 114 of the circuit board retaining assembly 10 are pivotally mounted directly to and extend from the computer chassis C. In this embodiment, the chassis C defines a series of bosses 124 and associated stops 610, one corresponding to each lever 114 mounted on the chassis C, and the lever biasing member (not shown) is a torsion spring which is molded into each lever is 114, thus eliminating the need for a mounting bracket 112.

The present invention also provides a method for installing or removing hardware B in a chassis C using a circuit board retaining assembly 10. The method includes the steps of mounting the retaining assembly 10 to the chassis C, disengaging the lever 114 from an engaged position in the mounting bracket 112 to permit its movement to a disengage position, installing or removing hardware B in the chassis C, and restoring the lever 114 to its original, engaged position. In one embodiment, the circuit board retaining assembly 10 further includes a securement device 810 including a securement device biasing member 812 disposed within a first end 210 of the lever 114 and the method further includes the steps of disengaging the securement device 810 prior to the step of disengageing the lever 114 from the mounting bracket 112, and re-engaging the securement device 810 following the step of re-engaging the lever in the mounting bracket 112. Where, as in the third embodiment, the lever 114 is mounted directly onto the chassis C, the method for installing or removing hardware B in a chassis C using a retaining assembly 10 is unchanged.

The foregoing has provided a detailed description of several embodiments of the present invention. Various modifications and additions can be made without departing from the spirit and scope of the invention. For example, the term "fastener" as used herein should be taken broadly to include a variety of different fastening devices that removably secure the mounting bracket of the present invention to the computer chassis. The term "biasing member" as used herein should be taken broadly to include a variety of different biasing members that provide a separating force when disposed between elements of the retaining assembly of the present invention. Moreover, the term "cutout" as used herein is defined broadly to include any opening that enables a portion of the securement device (e.g., a screw shaft) to pass through to engage the underlying base (e.g., the chassis) while being sufficiently narrow to enable an overlying lever face to contact the surrounding sides of the cutout to bias the board mounting bracket firmly against the underlying base. Accordingly, this description is meant to be taken only by way of example, and not to otherwise limit the scope of this invention.

What is claimed is:

1. A retaining assembly for releasably coupling a component to a chassis, the retaining assembly comprising:

a mounting bracket attached to the chassis, the mounting bracket defining at least one lever opening, a lever pivotally received in the lever opening, the lever including a first end for engaging the component in the chassis, a securement device slidably captured in the first end of the lever for securing the first end of the lever and the component to the chassis, and a lever biasing member for biasing the lever away from the component when the lever is disengaged, whereby the component can be uncoupled from the chassis.

2. The retaining assembly as set forth in claim 1, further comprising a securement device biasing member for biasing the securement device away from the chassis.

3. The retaining assembly as set forth in claim 2, wherein the securement device biasing member is disposed about the securement device.

4. The retaining assembly as set forth in claim 2, wherein the securement device biasing member is a compression spring.

5. The retaining assembly as set forth in claim 1, wherein the securement device is a screw having a screw head formed for engaging a tool and a partially threaded screw shaft.

6. The retaining assembly as set forth in claim 1, wherein the securement device is a screw having a screw head formed for being manually manipulated and a partially threaded screw shaft.

7. The retaining assembly as set forth in claim 1, wherein the mounting bracket further defines a boss and the lever biasing member is a torsion spring disposed about the boss, the torsion spring having a first end which is positioned about the first end of the lever and a second end which is positioned on the mounting bracket.

8. A retaining assembly for releasably coupling a component to a chassis, the chassis including at least one mounting opening, the retaining assembly comprising:

a lever pivotally received in the mounting opening, the lever having a first end for coupling the component and the chassis, a lever biasing member for biasing the lever away from the component when the lever is disengaged to uncouple the component from the chassis, a securement device slidably captured in the first end of the lever, the securement device for securably coupling the first end of the lever and the component to the chassis, and a securement device biasing member for biasing the securement device away from the chassis when the securement device and the first end of the lever are disengaged from the chassis.

9. An assembly for coupling a component to a chassis, the assembly comprising:

a mounting bracket attached to the chassis, the mounting bracket defining a first lever opening;

a lever, having a first end and a second end, the first end pivotally positioned in the first lever opening;

a securement device slidably captured in the second end of the lever, the securement device releasably attachable to a second lever opening in the chassis; and a lever biasing member, coupled to the lever, for biasing the lever away from the second lever opening if the securement device is not releasably attached to the second lever opening.

10. An assembly for coupling a component to a chassis comprising first and second lever openings, the assembly comprising:

a lever, having a first end and a second end, the first end pivotally positioned in the first lever opening;

a securement device slidably captured in the second end of the lever, the securement device releasably attachable to the second lever opening; and a lever biasing member, coupled to the lever, for biasing the lever away from the second lever opening if the securement device is not releaseably attached to the second lever opening.

11. A retaining assembly for releasably coupling a component to a chassis, the retaining assembly comprising:

a mounting bracket attached to the chassis, the mounting bracket defining at least one lever opening, a lever pivotally received in the lever opening, the lever including a first end for engaging the component in the chassis, means for securing the first end of the lever and the component to the chassis, and means for biasing the lever away from the component when the lever is disengaged, whereby the component can be uncoupled from the chassis.

* * * * *

UNITED STATES PATENT AND TRADEMARK OFFICE
CERTIFICATE OF CORRECTION

PATENT NO. : 6,471,310 B2
DATED : October 29, 2002
INVENTOR(S) : Montagna

It is certified that error appears in the above-identified patent and that said Letters Patent is hereby corrected as shown below:

<u>Title page, Item [54] and Column 1, line 1</u>,
Title, replace "CIRCUIT BOARD RETAINING ASSEMBLY" with -- CIRCUIT BOARD RETAINING ASSEMBLY AND METHOD FOR USE --

Signed and Sealed this

Twenty-second Day of June, 2004

JON W. DUDAS
*Acting Director of the United States Patent and Trademark Office*